(12) United States Patent
Van Putte et al.

(10) Patent No.: US 12,125,668 B2
(45) Date of Patent: Oct. 22, 2024

(54) ELECTRON MICROSCOPY GRID

(71) Applicants: UNIVERSITEIT ANTWERPEN, Antwerp (BE); IMEC VZW, Leuven (BE); UNIVERSITEIT GENT, Ghent (BE)

(72) Inventors: Wouter Van Putte, Diksmuide (BE); Jean-Pierre Timmermans, Mol (BE); Jan Vanfleteren, Gentbrugge (BE)

(73) Assignees: UNIVERSITEIT ANTWERPEN, Antwerp (BE); IMEC VZW, Leuven (BE); UNIVERSITEIT GENT, Ghent (BE)

( * ) Notice: Subject to any disclaimer, the term of this patent is extended or adjusted under 35 U.S.C. 154(b) by 433 days.

(21) Appl. No.: 17/431,849

(22) PCT Filed: Feb. 25, 2020

(86) PCT No.: PCT/EP2020/054930
§ 371 (c)(1),
(2) Date: Aug. 18, 2021

(87) PCT Pub. No.: WO2020/173952
PCT Pub. Date: Sep. 3, 2020

(65) Prior Publication Data
US 2022/0157559 A1 May 19, 2022

(30) Foreign Application Priority Data
Feb. 25, 2019 (EP) ..................................... 19158982

(51) Int. Cl.
*H01J 37/26* (2006.01)
*B01J 19/00* (2006.01)

(52) U.S. Cl.
CPC ......... *H01J 37/261* (2013.01); *B01J 19/0046* (2013.01); *B01J 2219/00432* (2013.01)

(58) Field of Classification Search
CPC .......... H01J 37/26; H01J 37/261; H01J 37/28; H01J 37/295; H01J 37/2955; B01J 19/0046; B01J 2219/00432
See application file for complete search history.

(56) References Cited

U.S. PATENT DOCUMENTS 9,548,184 B2    1/2017  Creemer et al.
2007/0134699 A1*  6/2007  Glover, III ........... B01J 19/0046
                                                      977/924

(Continued)

FOREIGN PATENT DOCUMENTS

CN    101057309 A    10/2007
EP    3050620 A1     8/2016
(Continued)

OTHER PUBLICATIONS

International Search Report and Written Opinion from PCT Application No. PCT/EP2020/054930, Jun. 9, 2020.
(Continued)

*Primary Examiner* — David E Smith
(74) *Attorney, Agent, or Firm* — Workman Nydegger

(57) ABSTRACT

An electron microscopy grid, includes: (i) a perforated substrate, (ii) a support film on the perforated substrate, the support film having a thickness of 60 Å or less, and (iii) linkers attached on top of the support film. The linkers has at least one affinity group for immobilizing an analyte; wherein the linkers form a non-random pattern on the support film.

16 Claims, 6 Drawing Sheets

(56) References Cited

U.S. PATENT DOCUMENTS

| | | | | |
|---|---|---|---|---|
| 2010/0143198 A1* | 6/2010 | Damiano, Jr. | ....... | G01N 23/046 216/2 |
| 2013/0292568 A1* | 11/2013 | Bizen | ..................... | H01J 37/244 250/311 |
| 2016/0032281 A1* | 2/2016 | Utlaut | .................. | C12Q 1/6806 506/40 |
| 2018/0017558 A1* | 1/2018 | Terfort | .................... | H01J 37/20 |
| 2018/0065105 A1 | 3/2018 | Song et al. | | |

FOREIGN PATENT DOCUMENTS

| | | | | |
|---|---|---|---|---|
| WO | 2009002506 A2 | 12/2008 | | |
| WO | 2009035727 A2 | 3/2009 | | |
| WO | WO-2011012844 A1 * | 2/2011 | ........... | C12Q 1/6806 |
| WO | 2012094634 A2 | 7/2012 | | |

OTHER PUBLICATIONS

Extended Search Report from corresponding EP Application No. EP19158982.9, Nov. 7, 2019.

Chou et al., "Sub-10 nm Imprint Lithography and Applications," Journal of Vacuum Science & Technology B: Microelectronics and Nanometer Structures Processing, Measurement, and Phenomena, vol. 15, Issue 6, Nov. 30, 1997, pp. 2897-2904.

Kelly et al., "The Affinity Grid: A Pre-fabricated EM Grid for Monolayer Purification," Journal of Molecular Biology, vol. 382, Issue No. 2, Jul. 16, 2008, pp. 423-433.

Liu et al., "A Graphene Oxide Streptavidin Complex for Biorecognition—Towards Affinity Purification," Advanced Functional Materials, vol. 20, Issue No. 17, Sep. 9, 2010, pp. 2857-2865.

Suk et al., "Transfer of CVD-Grown Monolayer Graphene onto Arbitrary Substrates," ACS nano, vol. 5, Issue No. 9, Sep. 6, 2011, pp. 6916-6924.

Kimple et al., "Overview of Affinity Tags for Protein Purification," Current Protocols in Protein Science, vol. 73: Unit 9.9, Sep. 24, 2013, 26 pages.

Passmore et al., "Specimen Preparation for High-Resolution Cryo-EM," Methods in Enzymology, vol. 579, Jan. 1, 2016, pp. 51-86.

Liu et al., "Bioactive Functionalized Monolayer Graphene for High-Resolution Cryo-Electron Microscopy," Journal of the American Chemical Society, vol. 141, Issue No. 9, Feb. 6, 2019, pp. 4016-4025.

Chinese Office Action from corresponding CN Application No. 202080016437.8, Jul. 10, 2024.

* cited by examiner

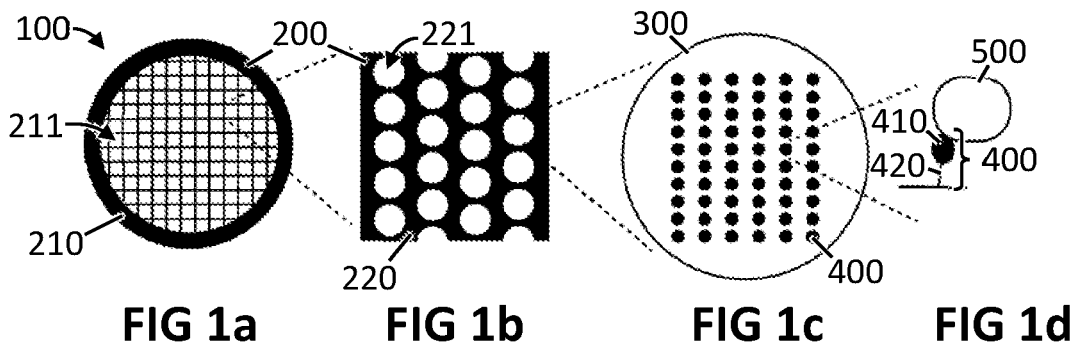
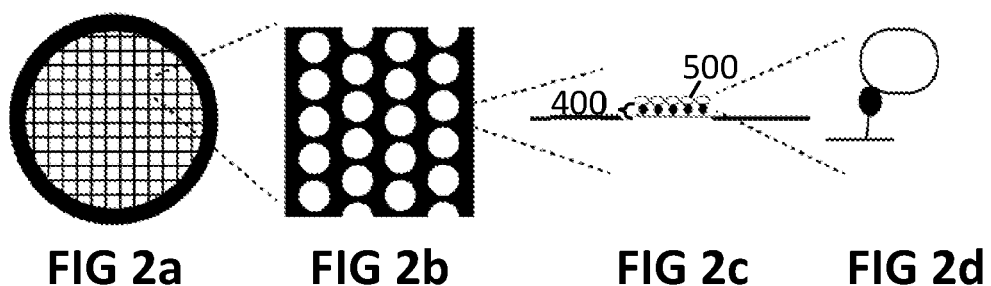
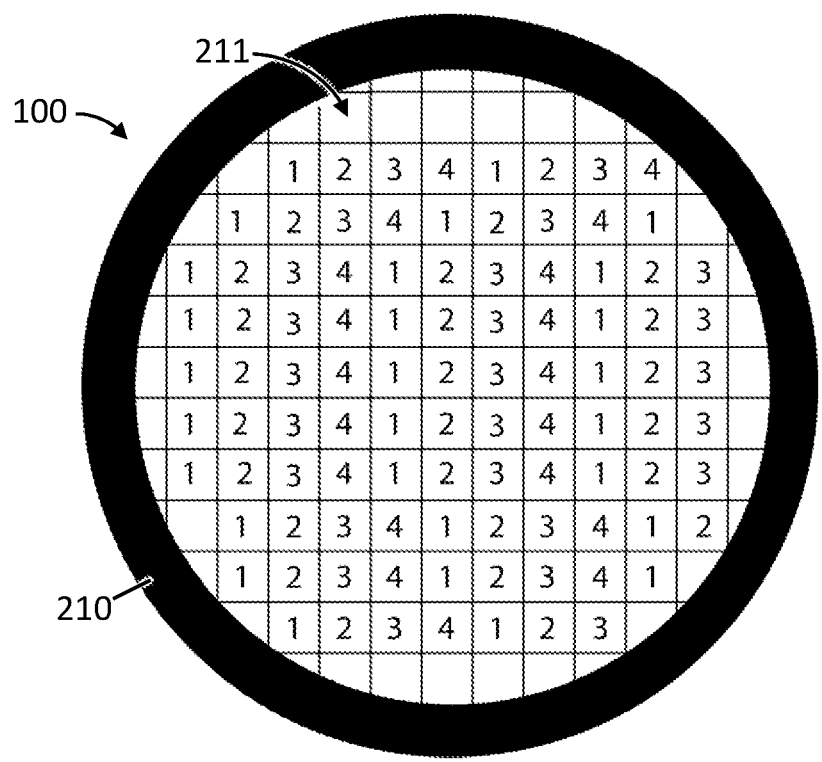
FIG 3

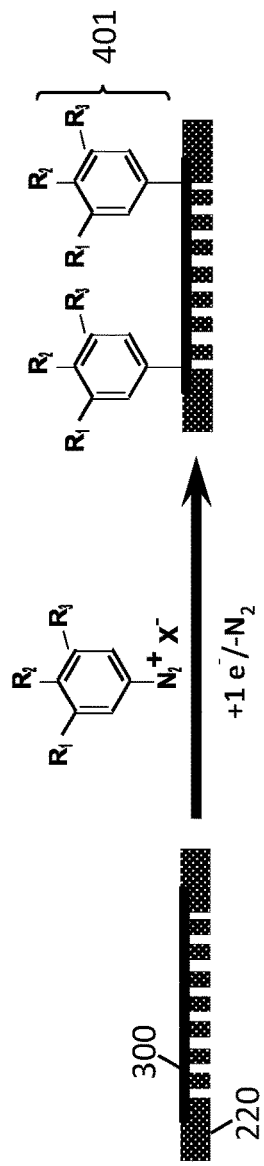
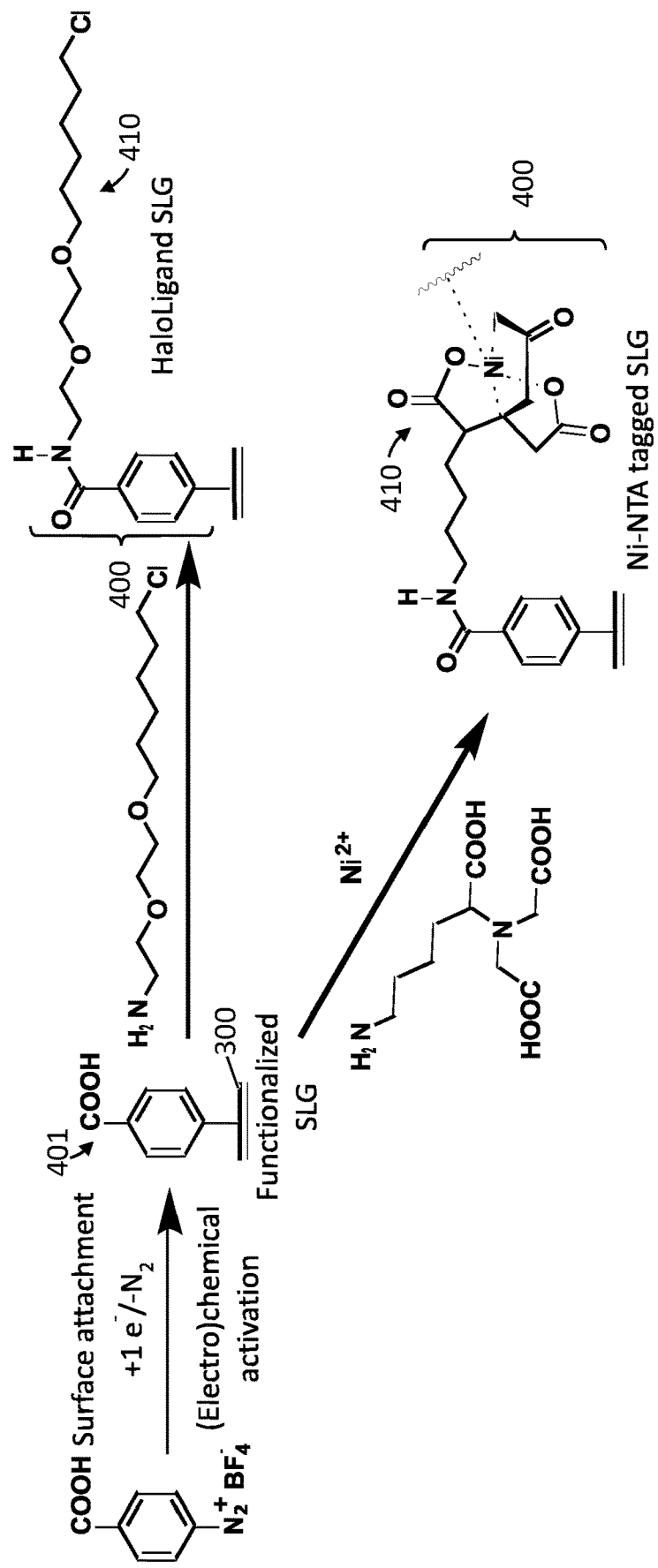
FIG 4
FIG 5

ELECTRON MICROSCOPY GRID

TECHNICAL FIELD OF THE INVENTION

The present invention relates to electron microscopy (EM) grids for immobilizing an analyte and to methods for forming and using such electron microscopy grids.

BACKGROUND OF THE INVENTION

In the past, high-resolution protein structure determination was mainly done using X-ray crystallography and, to a lesser extent, nuclear magnetic resonance. However, recent progress in electron microscopy hardware and image processing software has led to the use of cryo-electron microscopy (cryo-EM) and single particle analysis to visualize high-resolution protein structures. Moreover, cryo-EM has ample potential to become a high-throughput method for protein structure determination, that can consequently be used for drug development.

One of the major bottlenecks in this respect is specimen preparation, which encompasses the entire process ranging from protein purification to electron microscopy grid vitrification. Specifically, standard protein purification strategies, using affinity chromatography, do not always work for specific protein targets such as unstable protein complexes or membrane proteins and require optimizations in the buffer composition (e.g. detergents, cofactors, salts, pH, etc.). Additionally, the typical approach of priming electron microscopy grids with the protein of interest followed by paper blotting and plunge freezing, often results in inferior quality grids with a suboptimal protein particle distribution (e.g. too crowded, protein degradation at the water-air interface, too diluted, positioned at the edges, preferential orientations) or non-amorphous ice (e.g. hexagonal or cubic ice). These parameters are hard to control, which is why typically a multitude of EM grids need to be screened before the optimal conditions are found. Moreover, optimal conditions, once found, are often difficult to reproduce. A better control of the different steps that influence EM grid quality, would therefore greatly improve the overall workflow of cryo-EM, and as such would contribute to high-throughput protein structure determination by cryo-EM. Multiple novel technologies have been proposed to optimize the electron microscopy sample preparation process, such as novel grid types and blotless grid-priming procedures based on novel deposition methods. Specifically, for electron microscopy grids, one can distinguish two main strategies for grid optimization: (i) the usage of an additional support layer composed of graphene or a derivative thereof or (ii) the use of affinity grids comprising a functionalized surface. The former uses the advantages of graphene to develop grids with enhanced electron conductivity, strength and the ability to attach proteins (see e.g. PASSMORE, Lori A.; RUSSO, Christopher J. Specimen preparation for high-resolution cryo-EM. In: *Methods in enzymology*. Academic Press, 2016. p. 51-86.), while the latter focuses on the on-grid purification of specific proteins carrying or having a specific tag or feature that enables them to be immobilized selectively with respect to other contaminants (see e.g. KELLY, Deborah F., et al. The Affinity Grid: a pre-fabricated EM grid for monolayer purification. *Journal of molecular biology*, 2008, 382.2: 423-433.). However, these approaches each come with their own challenges and shortcomings.

Liu et al. combines the advantages of both methods, by disclosing the functionalization of graphene oxide (GO) with streptavidin (LIU, Zunfeng, et al. A graphene oxide streptavidin complex for biorecognition—towards affinity purification. Advanced Functional Materials, 2010, 20.17: 2857-2865.). The resulting GO-streptavidin complex was deposited on a continuous carbon grid and exposed to a solution of biotinylated Au nanoparticles (NPs), to capture the Au NPs. Transmission electron microscopy images showed the random spread of Au NPs on the surface. The authors conclude that the GO-streptavidin complexes they devised can be used for affinity purification of biotinylated protein complexes.

There remains however a need for better approaches for loading an analyte on an EM grid, which are for example more flexible (e.g. allowing different kinds of tags) and resolve further problems limiting the throughput of cryo-electron microscopy.

SUMMARY OF THE INVENTION

It is an object of the present invention to provide a good electron microscopy grid. It is a further object of the present invention to provide good methods for fabricating and using such an electron microscopy grid. This objective is accomplished by products and methods according to the present invention.

It is an advantage of embodiments of the present invention that several different stages and aspects relating to image acquisitioning and image processing of analytes on EM grids can be improved.

It is an advantage of embodiments of the present invention that better (e.g. more reproducible) affinity EM grids can be fabricated, in which there is a better control over the spread of analytes. It is a further advantage of embodiments of the present invention that image acquisition can thereby be improved (e.g. made more reliable and/or sped up) and that the need for grid screening in high numbers can be reduced substantially.

It is an advantage of embodiments of the present invention that analytes can be discerned from contaminants with higher fidelity. It is a further advantage of embodiments of the present invention that image processing can thereby be improved (e.g. made more reliable and/or sped up).

It is an advantage of embodiments of the present invention that the buffer solution over the immobilized analytes can be changed prior to imaging without washing away the analytes. It is a further advantage of embodiments of the present invention that this allows to uncouple the conditions under which the analytes are applied to the grid from those under which the analyte is visualized; e.g. by using a first buffer which promotes good immobilization conditions and a second buffer which promotes the analytes to adopt a particular configuration of interest. It is yet a further advantage of embodiments of the present invention that this change of buffer enables to investigate analyte-analyte interactions on the grid, for example, by immobilizing proteins and subsequently binding small molecule drugs thereto.

It is an advantage of embodiments of the present invention that the EM grid can have a low background signal in EM imaging.

It is an advantage of embodiments of the present invention that the methods of production and use of the EM grid can be relatively straightforward and economical.

It is a further advantage of embodiments of the present invention that high-throughput imaging and image processing of EM grids is facilitated.

It is an advantage of embodiments of the present invention that the analyte can be immobilized in different orientations on a single EM grid.

It is an advantage of embodiments of the present invention that linkers with different affinity groups can be combined on a single EM grid. This enables performing multiplex experiments with different analytes.

It is an advantage of embodiments of the present invention that multiplexing experiments with different analytes interacting with other analytes can be combined on a single EM grid.

In a first aspect, the present invention relates to an electron microscopy (EM) grid, comprising: (i) a perforated substrate, (ii) a support film on the perforated substrate, the support film having a thickness of 60 Å or less, preferably 20 Å or less, more preferably 10 Å or less, most preferably 3 Å or less, and (iii) linkers attached on top of the support film, the linkers comprising at least one affinity group for immobilizing an analyte; wherein the linkers form a non-random pattern on the support film.

In a second aspect, the present invention relates to a method for forming an electron microscopy grid comprising a perforated substrate having a support film thereon, comprising: (a) attaching linkers in a non-random pattern on top of a support film, the linkers comprising at least one affinity group for immobilizing an analyte, the support film having a thickness of 60 Å or less, preferably 20 Å or less, more preferably 10 Å or less, most preferably 3 Å or less; wherein either the support film is on the perforated substrate or the method further comprises a step (b), performed after step (a), of providing the support film on the perforated substrate.

In a third aspect, the present invention relates to a kit-of-parts for forming an electron microscopy grid, comprising: (i) a perforated substrate, (ii) a support film having a thickness of 60 Å or less, preferably 20 Å or less, more preferably 10 Å or less, most preferably 3 Å or less, and having linkers attached thereon in a non-random pattern, the linkers comprising at least one affinity group for immobilizing an analyte.

In a fourth aspect, the present invention relates to a use of a support film having linkers forming a non-random pattern thereon, said linkers comprising at least one affinity group for immobilizing an analyte, for imaging the analyte by electron microscopy.

In a fifth aspect, the present invention relates to a method for processing an electron microscopy image of an analyte immobilized on an electron microscopy grid as defined in any embodiment of the first aspect, comprising: (a) selecting image regions from the electron microscopy image, each selected image region corresponding to one of the linkers forming the non-random pattern; and (b) processing the selected image regions.

In a sixth aspect, the present invention relates to a method for acquiring and processing electron microscopy images of an electron microscopy grid as defined in any embodiment of the first aspect, the electron microscopy grid comprising an analyte immobilized at predetermined positions thereof according to the non-random pattern, the method comprising: (a) selecting grid regions from the electron microscopy grid, each selected grid region corresponding to one of the linkers forming the non-random pattern; and (b) acquiring images for each selected grid region.

In a seventh aspect, the present invention relates to a system comprising means for carrying out the method according to any embodiment of the fifth or sixth aspect.

In an eighth aspect, the present invention relates to a computer program product comprising instructions which, when the program is executed by a computer, cause the computer to carry out the method according to any embodiment of the fifth or the sixth aspect.

In a ninth aspect, the present invention relates to a computer-readable storage medium comprising instructions which, when executed by a computer, cause the computer to carry out the method according to any embodiment of the fifth or the sixth aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1, including FIGS. 1a-1d, FIG. 2, including FIGS. 2a-2d, and FIG. 3 show schematic representations of EM grids, in accordance with exemplary embodiments of the present invention.

FIG. 4 schematically depicts a strategy for providing a functionalized support film on a perforated substrate, in accordance with an exemplary embodiment of the present invention.

FIG. 5 and FIG. 6 schematically depict the attachment of different affinity groups to linker precursors, in accordance with exemplary embodiments of the present invention.

Figure 6:
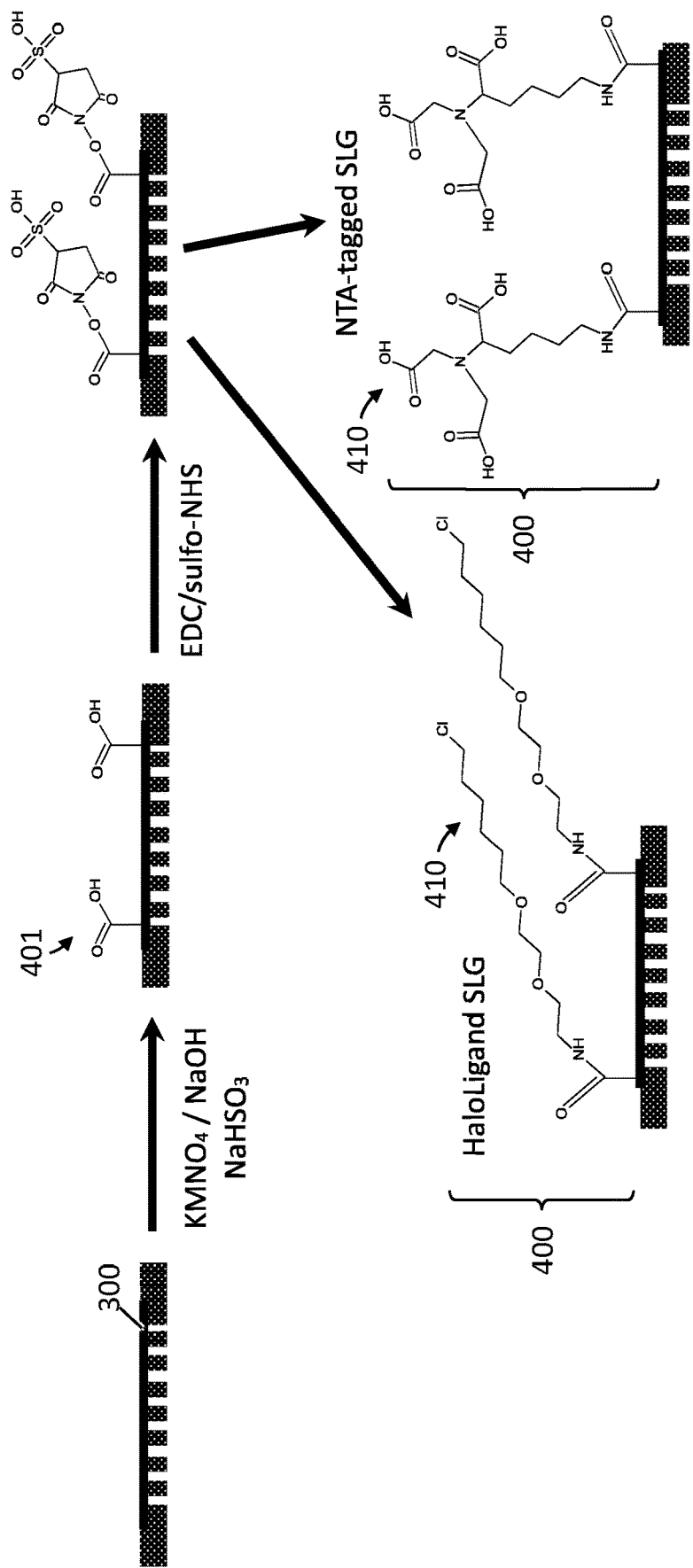

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, over, under and the like in the description and the claims are used for descriptive purposes and not necessarily for describing relative positions. It is to be understood that the terms so used are interchangeable with their antonyms under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practised without these specific details. In other instances, well-known methods, structures and techniques have not been shown in detail in order not to obscure an understanding of this description.

As used herein, and unless provided otherwise specified, the term "perforated" means having through-holes therein.

In a first aspect, the present invention relates to an electron microscopy (EM) grid, comprising: (i) a perforated substrate, (ii) a support film on the perforated substrate, the support film having a thickness of 60 Å or less, preferably 20 Å or less, more preferably 10 Å or less, most preferably 3 Å or less, and (iii) linkers attached on top of the support film, the linkers comprising at least one affinity group for immobilizing an analyte; wherein the linkers form a non-random pattern on the support film.

The electron microscopy grid may alternatively be referred to as an electron microscopy sample support. In embodiments, the electron microscopy may be a transmission electron microscopy (TEM). Thus, the EM grid may be a TEM grid. In embodiments, the electron microscopy grid may be used for cryo-electron microscopy and/or negative stain electron microscopy, preferably for cryo-electron microscopy. When used in a cryo-electron microscope, an analyte may typically be bound to the linkers (e.g. via the affinity groups) and a vitreous ice layer may be present on the EM grid to fix the configuration of the analyte. In embodiments, the vitreous ice layer may have a thickness of 300 nm or lower, preferably 150 nm or lower, yet more preferably 100 nm or lower.

In embodiments, the perforated substrate may comprise: (ia) a mesh structure, and (ib) a perforated sheet (e.g. a foil) on the mesh structure. In embodiments, the mesh structure may comprise (or consist of) a metal. In embodiments, the metal may be selected from the list of Cu, Ni, Ti, Si, Au, CuRh, Mo, Al and W. In embodiments, the perforated sheet (e.g foil) may comprise a material selected from amorphous carbon, Au, TiSi, SiN, $SiO_2$ and SiC. In embodiments, the perforated foil may have a thickness of from 1 to 50 nm, e.g. from 5 to 30 nm. In embodiments, the perforated sheet (e.g. a foil) may be a lacey foil (e.g. a lacey carbon foil), a holey foil (e.g. a holey carbon foil) or a Quantifoil. These perforated foils as such, as well as EM grids therewith (i.e. having said perforated foils on a mesh structure), are advantageously commercially available. In embodiments, the perforated substrate and/or the perforated sheet (e.g. foil) may comprise random perforations (e.g. as in lacey or holey foil) or regularly patterned perforations (e.g. as in Quantifoil).

In embodiments, the support film may be selected from graphene, graphene oxide and graphite. In other embodiments, the support film may be formed of another 2D material (e.g. a transition metal dichalcogenide or hexagonal boron nitride), another carbon-based material (e.g. amorphous carbon, diamond or diamond-like carbon), a semiconductor material (e.g. a thin layer of silicon or silicon dioxide), an organic molecule (e.g. a self-assembled monolayer, SAM) or a bio-molecule. In embodiments, the support film may be molecularly or atomically thin, preferably atomically thin. In embodiments, the support film may be a molecular monolayer (e.g. a SAM) or an atomic monolayer (e.g. single-layer graphene or other 2D material); preferably an atomic monolayer. Thinner support films advantageously interfere less with the EM imaging; the EM signal (i.e. the effect on amplitude and phase contrast) produced by vanishingly thin (e.g. atomically thin) support films may, for example, be neglectable. In embodiments, the EM grid may be for (i.e. suitable for) protein structure determination. In embodiments, the protein structure determination may have a resolution of 10 Å or less; i.e. it may be a high-resolution protein structure determination. Protein structure determination typically hinges on a good analyte EM signal—with minimal interference from the EM grid. In that respect, support films having a thickness of 20 Å or less typically yield a suitable signal-to-noise ratio, which is further improved for thicknesses of 10 Å or less, etc.; such thicknesses are therefore increasingly preferred. For comparison, a single graphene layer has a thickness of about 3 Å (e.g. 3.35 Å) In embodiments, the support film may be an ordered (e.g. crystalline) support film. Ordered support films advantageously yield an EM signal (e.g. a regular EM signal) which can be subtracted from the overall EM signal, thereby reducing or removing the influence of the ordered support film on the EM imaging. In preferred embodiments, the support film may be a conductive support film. Conductive support films advantageously provide an avenue for electrical charge carriers to dissipate in, thereby counteracting local charging effect (e.g. on the analyte) that can occur and that may influence the EM signal.

In embodiments, the at least one affinity group may be selected from the list of a deoxyribonucleic acid (DNA), a ribonucleic acid (RNA), a sugar, a peptide, a protein (e.g. an antibody or a nanobody), a lipid, a nickel nitrilotriacetic acid (Ni-NTA), cobalt nitrilotriacetic acid (Co-NTA), HaloTag® Ligand (e.g. obtained from Promega), SnapTag® Ligand (e.g. obtained from NEB), SpyTag, SpyCatcher, a peptide sequence recognized and ligated by Sortase A, or any other natural or synthetic chemical probe that can be used to selectively bind a specific analyte. In embodiments, the affinity tag may be selected from the list of HisTag, a HaloTag®, a SnapTag®, SpyTag, SpyCatcher, etc. Other useable affinity tags and corresponding affinity groups are for example, without being limited thereto, as described by Kimple et al. (KIMPLE, Michelle E.; BRILL, Allison L.; PASKER, Renee L. Overview of affinity tags for protein purification. Current protocols in protein science, 2013, 73.1: 9.9. 1-9.9. 23.), which is incorporated herein by reference; see therein for example Table 9.9.1. In embodiments, the linkers may comprise at least one first linker comprising a first affinity group and at least one second linker comprising a second affinity group, the second affinity group differing from the first affinity group. By combining affinity groups of a different nature on a single EM grid, e.g. each having an affinity for different analytes, multiplex measurements can advantageously be performed. Furthermore, such an EM grid may also be used to test the binding affinity of an analyte simultaneously towards several affinity groups, e.g. when the preferred affinity group for the analyte in question is not yet determined. Such an EM grid could, for example, be leveraged as a drug screening platform to validate and identify potential binding partners (hit validation, lead optimization, etc.) and to provide structural information on their binding position.

In embodiments, the analyte may be any analyte on which EM imaging may be performed. In preferred embodiments, the analyte may be a biomolecule, preferably a protein. Prior to being provided on the EM grid, the analyte may have undergone a chromatographic separation, e.g. based on one or more parameters selected from the list of size, weight, affinity and charge.

It was surprisingly found within the present invention that by immobilizing the analyte in the non-random pattern, several different stages and aspects relating to imaging of EM grids can be improved. For example, the image acquisition and/or image processing are ameliorated, because one can predict where the analytes are to be found (cf. the fifth aspect). Furthermore, analytes and contaminants can be discerned from one another with higher fidelity, because the analytes are immobilized in discrete non-random locations, while the contaminants remain randomly spread out over the area (cf. the fifth aspect). Moreover, the spread and the concentration of the analyte on the grid is controlled and can be well optimized. This, in turn, leads to better (e.g. more reproducible) EM grids and a reduced need for large volume grid screening (e.g. through finding the optimal protein concentration or allowing to work with cruder samples). Additionally, because the analytes are immobilized, it is possible to exchange the buffer solution prior to imaging (e.g. just before vitrification) from the one used to provide the analytes on the EM grid. Furthermore, the second buffer can include auxiliary analytes such as small molecules that can interact with the immobilized analytes.

The linkers are a plurality of linkers. In embodiments, the linkers may be 3 or more linkers, preferably 5 or more linkers, yet more preferably 10 or more linkers. The linkers may be identical or may comprise two or more different linkers.

In embodiments, the linkers may consist of spacers, such as for example ethylene glycol or an oligo ethylene glycol having from two to ten repeat units, and affinity groups attached to the spacers. In embodiments, the linkers may have a length of 100 nm or below, preferably 50 nm or below, such as between 1 nm and 20 nm. Since the vitreous ice layer provided on the EM grid for cryo-EM imaging may, for example, have a thickness of about 100 nm, it is advantageous that the analyte can be retained closer to the substrate than this thickness. The analyte is thereby prevented from extending beyond the air-water (e.g. air-ice) interface, which could otherwise influence its configuration; for example, a protein may deteriorate and partially disassemble when in contact with air. Additionally, by having a shorter linker length, the analyte is retained closer to the point of attachment of the linker and has a reduced range of movement. As such, the linkers may in that case be attached in a more closely packed pattern, without increasing the risk of overlap and/or interaction between neighbouring analytes. Conversely, the distribution of orientations in which the analyte can be found may be reduced when having a short linker length. This may have a negative effect on the EM image as the range of the angular distribution of the projections representing the analyte may be too limited, thereby affecting the quality and resolution of the 3D structure image of the analyte. For example, if the analyte would always be oriented in a similar manner with regard to the EM grid support film, the angular information would be restricted, thereby affecting the 3D reconstruction process that leads to the 3D protein structure determination. As such, a balance is typically sought for the linker length, which depends on the particulars of the analyte of interest (e.g. its size and configuration). Alternatively, in embodiments, the linkers may comprise linkers of differing lengths and/or differing chemical compositions; such as linkers having differing spacers. In embodiments, the linkers of different chemical composition may comprise linkers of different morphology (e.g. relatively straight vs angled, such as bent, linkers) By having different linkers on a single EM grid, different orientations of the analyte can advantageously be promoted simultaneously.

In embodiments, each of the linkers may have a point of attachment to the support film and it is the points of attachments that form a non-random pattern on the support film.

In embodiments, each of the linkers may have a point of attachment to the support film and the points of attachment may have a minimum separation distance between each other (i.e. a minimum separation distance from adjacent points of attachments) of between 10 and 300 nm, preferably between 15 and 100 nm, yet more preferably between 20 and 50 nm. The minimum separation distance is preferably adapted to the size of the analyte and/or to the linker length so that the analytes cannot possibly touch each other, but are close to each other. An optimal spread of the analytes across the image is preferred, as this will affect the number of images that will need to be acquired and hence the time needed to obtain a full dataset for high resolution analyte structure determination. In embodiments, the minimum separation distance may be at least 1 time, preferably at least 1.5 times, more preferably at least 2 times, yet more preferably at least 2.5 times the radius of the analyte. As used herein, the radius of an analyte is taken as being equal to half the length of the analyte, wherein the length of the analyte is its longest dimension in the state in which it is present on the support film (e.g. in the case of the analyte being a protein, typically the length of its tertiary (or quaternary) structure, not the length of the primary structure). In embodiments, the minimum separation distance may be at least 1.5 times, preferably at least 2 times, yet more preferably at least 2.5 times the length of the longest linker forming the pattern.

It will be clear that—when it is said that the linkers form a non-random pattern—this refers to the ordering of the individual linkers as such (i.e. of their individual points of attachment). This is to be distinguished from situations in the prior art that refer to patterned zones of linkers/analytes, but wherein the linkers/analytes are essentially randomly distributed within each zone. Contrary to such prior art, the present invention advantageously allows to control the position of the individual analyte particles—when bound to the linkers—at the nanoscale. In embodiments, the non-random pattern may be a regular pattern. The non-random pattern may, for example, be built up of rows (e.g. rows of points of attachments) with a single constant pitch (i.e. distance between neighbouring points within a row), or with a discrete number of different pitches. In turn, the rows may be separated from one another by a single constant pitch (e.g. the same or a different constant pitch than present within the rows), or with a discrete number of different pitches. In embodiments, the points of attachments within each row might be aligned with point of attachments within neighbouring rows, thereby forming vertical lines of points of attachments and hence a grid of points of attachments. In other embodiments, the points of attachments within each row might be offset with respect to the points of attachments within neighbouring rows, thereby forming diagonal lines of points of attachments. In this last case, the offset may for instance be equal to half the distance between two points of attachments. In that case, if the pitch within a row is equal to the pitch within diagonal lines of points of attachment, a hexagonal pattern can be obtained (see FIG. 10 and FIG. 11). In embodiments, each of the linkers may have a point of attachment to the support film and the points of attachment may form a regular pattern having a pitch of between 10 and 300 nm, preferably between 15 and 100 nm, yet more preferably between 20 and 50 nm. In embodiments, the pitch may correspond to the minimum separation distance (cf. supra). These pitches may be used for separating neighbouring points within a row and/or between rows. The pitch is preferably adapted to the size of the analyte and/or to the linker length (cf. supra). Nevertheless, a regular pattern is not strictly required for the present invention, as long as the non-random pattern is predictable (within the natural margin of experimental error, see also embodiments of the second aspect); i.e. the pattern in which the linkers are attached to the support layer is known. Said known pattern can then, for example, be input into a particle picking algorithm.

In a second aspect, the present invention relates to a method for forming an electron microscopy grid comprising a perforated substrate having a support film thereon, comprising: (a) attaching linkers in a non-random pattern on top of a support film, the linkers comprising at least one affinity group for immobilizing an analyte, the support film having a thickness of 60 Å or less, preferably 20 Å or less, more preferably 10 Å or less, most preferably 3 Å or less; wherein either the support film is on the perforated substrate or the method further comprises a step b, performed after step a, of (b) providing the support film on the perforated substrate.

In embodiments, step a of attaching linkers on top of the support film may comprise: (a1) providing a patterned mask on top of the support film, the patterned mask having openings therein forming a non-random pattern, the openings exposing the support film and having a width of 20 nm or less, preferably 10 nm or less; (a2) attaching in the openings the linkers or precursors thereof to the exposed support film; (a3) removing the patterned mask; and (a4) if precursors are attached in step a2, transforming the precursors into the linkers. In embodiments, step a4 may be performed after step a2 and either before or after step a3. In embodiments, the openings in the patterned mask may be made by e-beam lithography or nanoimprinting. In embodiments, the support film may be a carbon-based support film (e.g. graphene, graphene oxide, graphite, amorphous carbon, diamond or diamond-like carbon). In some embodiments, the linkers or precursors thereof may comprise a diazonium group for attaching to the exposed support film in step a2. In embodiments, step a2 may comprise an electrochemical or chemical activation of the diazonium group (e.g. an electrochemical or chemical reduction). In other embodiments, the linkers or precursors thereof may be (or comprise) a carboxyl group or another chemical group. A carboxyl group may for example be formed on graphene through an oxidation procedure based on $KMnO_4$, while other chemical groups can be attached through plasma-based chemical functionalization. In embodiments, transforming the precursors into the linkers may comprise coupling a compound comprising the affinity group to the precursors. In embodiments, the support film may be functionalized (e.g. with a carboxyl group or other chemical group, cf. supra) prior to step a1 and step a2 may comprise attaching the linkers or precursors thereof to the exposed functionalized support film.

In embodiments, step a2 may attach in each of the openings zero or one of the linkers or precursors thereof. It will be evident that, being a chemical reaction, a perfect functionalization of one linker or one precursor thereof in each opening cannot be assured, particularly given the limited size of the opening and thus the limited accessibility of the thereby exposed part of the support film. Nevertheless, within the present invention, as long as a linker or precursor thereof is attached in at least 10% of the openings, preferably at least 25%, more preferably at least 50%, yet more preferably at least 75, most preferably at least 90%, such as 95% or 99%, the linkers or precursors thereof are still considered to form a non-random pattern. Indeed, even for such imperfect functionalization, the locations of the linkers will still be sufficiently predictable (e.g. because the number of possible locations is still reduced to a discrete number, rather than being essentially infinite) and controllable (e.g. in terms of ensuring a minimum separation distance), and a considerable advantage over randomly located linkers is still achieved.

In some embodiments, when the support film in step a is on the perforated substrate, the perforated substrate having the support film assembled thereon may be provided as such. For example, a perforated substrate with a pre-assembled support film may be commercially purchased and provided for use in step a. In other embodiments, when the support film in step a is on an auxiliary substrate, step b of providing the support film on the perforated substrate may comprise: transferring the support film from the auxiliary substrate to the perforated substrate.

In some embodiments, before performing step a, the support film may be formed on the perforated substrate, or the support film and the perforated substrate may be assembled. In embodiments, transferring the support film may comprise a wet transfer, dry transfer or sandwich-based transfer (see Example 2b). Such a wet- or dry-transfer is described for pristine (i.e. unfunctionalized) graphene by Suk et al. (SUK, Ji Won, et al. Transfer of CVD-grown monolayer graphene onto arbitrary substrates. *ACS nano*, 2011, 5.9: 6916-6924.), which is incorporated herein by reference. The sandwich-based transfer of graphene onto non-copper supports with foils has been described in particular for electron microscopy grids by Passmore and Russo (PASSMORE, Lori A.; RUSSO, Christopher J. Specimen preparation for high-resolution cryo-EM. In: *Methods in enzymology*. Academic Press, 2016. p. 51-86.).

In embodiments, any feature of any embodiment of the second aspect may independently be as correspondingly described for any embodiment of any of the other aspects.

In a third aspect, the present invention relates to a kit-of-parts for forming an electron microscopy grid, comprising: (i) a perforated substrate, (ii) a support film having a thickness of 60 Å or less, preferably 20 Å or less, more preferably 10 Å or less, most preferably 3 Å or less, and having linkers attached thereon in a non-random pattern, the linkers comprising at least one affinity group for immobilizing an analyte.

The kit-of-parts may allow a user to assemble an EM grid as defined in any embodiment of the first aspect.

In embodiments, any feature of any embodiment of the third aspect may independently be as correspondingly described for any embodiment of any of the other aspects.

In a fourth aspect, the present invention relates to a use of a support film having linkers forming a non-random pattern thereon, said linkers comprising at least one affinity group for immobilizing an analyte, for imaging the analyte by electron microscopy. The known pattern of the individual linkers—and optionally of broader zones of linkers—is thereby used to define specific regions/positions with respect to the electron microscopy grid for imaging and/or image processing (cf. infra).

In embodiments, any feature of any embodiment of the fourth aspect may independently be as correspondingly described for any embodiment of any of the other aspects.

In a fifth aspect, the present invention relates to a method for processing an electron microscopy image of an analyte immobilized on an electron microscopy grid as defined in any embodiment of the first aspect, comprising: (a) selecting image regions from the electron microscopy image, each selected image region corresponding to one of the linkers forming the non-random pattern; and (b) processing the selected image regions (to extract structural information of the analytes).

In this context, the electron microscopy image to be processed typically encompasses several linkers. By contrast, image regions are selected within this larger image, which correspond to a single linker; i.e. the selected image regions correspond to single analyte projection images. In turn, these are processed to obtain structural information (e.g. a 3D structure) of the analytes.

In embodiments, the electron microscopy image may have been taken at such a magnification (and hence resolution), so as to maximize the number of usable analyte positions within one image. This advantageously permits to limit the number of images that need to be taken. For example, the magnification of the microscope may be adapted to obtain a pixel resolution of 1 Å per pixel; this corresponds to a 200×200 nm image for a 2k×2k detector. Such a resolution may typically be sufficient to obtain good structural information. In that case, further increasing magnification has the drawback of requiring overall more images to be taken, while having a limited effect on the quality of the information gained.

In embodiments, the method may be part of a particle picking algorithm (i.e. a method for determining the location of one or more analytes in an image, e.g. an EM image).

In embodiments, the present invention may relate to a method for processing an electron microscopy image of an electron microscopy grid as defined in any embodiment of the first aspect, the electron microscopy grid comprising an analyte immobilized at predetermined positions thereof according to the non-random pattern, the method comprising the steps of: (a1) overlaying and aligning with the non-random pattern present in the image, a template non-random pattern of locations stored in a memory and corresponding to the non-random pattern present in the image, (a2) selecting image regions from the electron microscopy image, each selected image region comprising a single location of the template non-random pattern, and (b) processing the selected image regions to extract structural information of the analytes.

In embodiments, the method may be a computer-implemented method. In embodiments, steps a, a1, a2 and/or b may be fully implemented by a generic data processing system.

In a sixth aspect, the present invention relates to a method for acquiring and processing electron microscopy images of an electron microscopy grid as defined in any embodiment of the first aspect, the electron microscopy grid comprising an analyte immobilized at predetermined positions thereof according to the non-random pattern, the method comprising: (a) selecting grid regions from the electron microscopy grid, each selected grid region corresponding to one of the linkers forming the non-random pattern; and (b) acquiring images for each selected grid region.

The acquired images for each selected grid region typically correspond to image regions as defined for the fifth aspect, i.e. single analyte projection images.

In embodiments, the method may be part of a particle picking algorithm (i.e. a method for determining the location of one or more analytes in an image, e.g. an EM image).

In embodiments, the present invention may relate to a method for acquiring and processing electron microscopy images of an electron microscopy grid as defined in any embodiment of the first aspect, the electron microscopy grid comprising an analyte immobilized at predetermined positions thereof according to the non-random pattern, the method comprising the steps of: (a1) overlaying and aligning with the non-random pattern present in the electron microscopy grid, a template non-random pattern of locations stored in a memory and corresponding to the non-random pattern present in the grid, (a2) selecting grid regions from the electron microscopy grid, each selected grid region comprising a single location of the template non-random pattern, and (b) acquiring images for each selected grid region.

In embodiments, the method may comprise a further step c of: (c) processing the acquired images to extract structural information of the analytes.

In embodiments, the method may be a computer-implemented method. In embodiments, steps a, a1, a2 and/or c may be fully implemented by a generic data processing system. In embodiments, step b may further comprise—for example in combination with a generic data processing system—the use of an electron microscope (e.g. a transmission electron microscope).

In embodiments of the fifth or sixth aspect, each image (or grid) region may have a width of 1 μnm or below, preferably 500 nm or below, more preferably 200 nm or below, yet more preferably 100 nm or below, such as between 20 and 40 nm. In embodiments, each image (or grid) region may have a height of 1 μnm or below, preferably 500 nm or below, more preferably 200 nm or below, yet more preferably 100 nm or below, such as between 20 and 40 nm. Each image (or grid) region may, for example, have a size of 1 μm×1 μm or below, preferably 500 nm×500 nm or below, more preferably 200×200 nm or below, yet more preferably 100×100 nm or below, such as between 20×20 and 40×40 nm. The size of the image (or grid) region is typically selected in function of the size of the analyte and of the size of the linker in such a way that the analyte can always fit in its entirety in the image (or grid) region. In this respect, smaller dimensions (e.g. 200 nm or less) may typically be more suitable for analytes such as proteins, whereas larger dimensions (e.g. more than 200 nm) may be more suitable for bigger analytes such as viruses or exosomes.

In embodiments, each image (or grid) region may be centred on a single different location of the template non-random pattern. Thereby, each image (or grid) region is centred on the point of attachment of one linker of the support film.

In the above methods, the known non-random pattern is advantageously used to discard other particles (e.g. contaminants) falling outside this non-random pattern. More specifically, by selecting only the image regions corresponding to the non-random pattern, i.e. those regions of the image where it is expected that an analyte can be found, the overall EM image is advantageously effectively filtered by disposing of contaminants in the EM image (which do not show an affinity to the linkers and are therefore randomly distributed over the EM image, thereby having a relatively low probability of appearing in a selected image region) while selecting analytes in the EM image (which do show an affinity to the linkers and are therefore immobilized in the non-random pattern, thereby having a relatively high probability of appearing in a selected image region). In doing so, either instead of or in combinations with presently known methods (e.g. based on machine learning for learning to recognize the analyte molecules in an EM image and selecting the analyte based thereon), particle picking can be made more reliable and the speed thereof and hence image processing can be significantly improved. Indeed, such contaminant projections would otherwise disturb the formation of good 2D and 3D class averages and hence would need to be removed through multiple image processing steps. This advantage of pre-filtering analytes from contaminants becomes especially relevant when working with crude, non-purified, protein mixtures.

Similarly, by selecting only the grid regions corresponding to the non-random pattern that are usable for high resolution information, i.e. those regions of the grid where it is expected that an analyte can be found, the overall EM image acquisition process is advantageously affected as the number of images can be optimized to get the necessary number of analyte boxes (i.e. particles), as one can estimate the number of particles per image.

Note that the present methods rely on the known non-random pattern of linkers, and thereby distinguish themselves from other automated image acquisition and image processing techniques, where such prior knowledge of particle positions is absent. Furthermore, the latter in combination with a functionalized graphene EM grid where different linkers with different functional groups are localized either in different zones of the grid or in a local pattern (cf. Example 1b), would enable one to immediately sub-select different linker groups when processing the imaging data.

In embodiments, any feature of any embodiment of the fifth or sixth aspect may independently be as correspondingly described for any embodiment of any of the other aspects.

In a seventh aspect, the present invention relates to a system adapted to (e.g. comprising means therefor) carry out the method according to any embodiment of the fifth or sixth aspect.

In embodiments, the system may comprise a data processing device adapted to carry out (computer-implemented) steps a, a1, a2 and/or b according to any embodiment of the fifth aspect, and/or a, a1, a2 and/or c according to any embodiment of the sixth aspect. In embodiments, the system may further comprise an electron microscope (e.g. a transmission electron microscope) for carrying out step b according to any embodiment of the sixth aspect.

The system may further comprise an electron microscopy grid as defined in any embodiment of the first aspect.

In embodiments, the system may comprise an image acquiring unit and/or an image processing unit adapted to only acquire and/or process image regions comprising a single location of the non-random pattern. In other words, the system may comprise an image acquiring unit and/or an image processing unit adapted to only acquire and/or process images of analytes immobilized by the linkers forming the non-random pattern.

In embodiments, the image processing unit may comprise: a memory storing a template non-random pattern, an overlying and aligning unit for overlaying and aligning the template non-random pattern with a non-random pattern present in the image, a selecting unit for selecting image regions from the electron microscopy image, each selected image region comprising a single location of the template non-random pattern, and a processor for processing the selected image regions to extract structural information of the analytes.

In embodiments, the image acquiring unit may comprise: a memory storing a template non-random pattern, an overlying and aligning unit for overlaying and aligning the template non-random pattern with a non-random pattern present in the image, a selecting unit for selecting image regions from the electron microscopy image, each selected image region comprising a single location of the template non-random pattern, and an image acquisition devise for acquiring images for each selected grid region, and a processor for processing the acquired images to extract structural information of the analytes.

In embodiments, any feature of any embodiment of the seventh aspect may independently be as correspondingly described for any embodiment of any of the other aspects.

In an eighth aspect, the present invention relates to a computer program (product) comprising instructions which, when the program is executed by a computer, cause the computer to carry out the method according to any embodiment of the fifth or the sixth aspect.

In embodiments, any feature of any embodiment of the eighth aspect may independently be as correspondingly described for any embodiment of any of the other aspects.

In a ninth aspect, the present invention relates to a computer-readable (storage) medium comprising instructions which, when executed by a computer, cause the computer to carry out the method according to any embodiment of the fifth or the sixth aspect.

In embodiments, any feature of any embodiment of the ninth aspect may independently be as correspondingly described for any embodiment of any of the other aspects.

The invention will now be described by a detailed description of several embodiments of the invention. It is clear that other embodiments of the invention can be configured according to the knowledge of the person skilled in the art without departing from the true technical teaching of the invention, the invention being limited only by the terms of the appended claims.

Example 1: EM Grid with Support Film

Example 1a

We now refer to FIG. 1 and FIG. 2, showing schematic representations of an EM grid (100) in accordance with embodiments of the present invention. In FIG. 1, the representations progressively zoom in from FIG. 1a to d, depicting a top view in FIG. 1a-c and a side view in FIG. 1d. FIG. 2 is the same as FIG. 1 but shows a side view for FIG. 2c. It should be clear that the pattern depicted in FIG. 1b. and FIG. 2b. reflects the pattern of the holes within the support film, while the pattern in FIG. 1c. and FIG. 2c reflects the pattern of the individual linkers.

The exemplary EM grid (100) comprises a perforated substrate (200), in the form of a mesh structure (210) and a perforated foil (220) on the mesh structure (210). The mesh structure (210) typically comprises a mesh (e.g. a frame) with multiple smaller holes (211; e.g. squares). The mesh can be metallic, e.g. made of Cu, Ni, Au, Si or another metal, or another material such as silicon dioxide. The perforated foil (220) comprises holes (221) arranged in a regular or irregular pattern, such as in holey, lacey or Quantifoil™ foils. The perforated foil (220) may be made of a carbon or metal (e.g. Au) material. The perforated foil (220) can in some instances be used to guide (e.g. partially automate) the image acquisition process, as the holes indicate the area where the image acquisition should take place.

A support film (300) is further provided on the perforated substrate (200; e.g. on the perforated foil 220) having linkers (400) thereto attached in a non-random pattern. The linkers (400) are such that they allow immobilizing an analyte of interest (500; e.g. a protein) in the non-random pattern. The support film (300) may, for example, be a graphene layer (e.g. single-layer graphene) chemically functionalized with the linkers (400).

The linkers (400) typically comprise an affinity group (410) for interacting with the analyte (500) and a spacer (420) between the affinity group (410) and the support film (300). The affinity group may be, for example, a deoxyribonucleic acid (DNA), a ribonucleic acid (RNA), a sugar, a peptide, a protein (e.g. an antibody or a nanobody), a lipid, a nickel nitrilotriacetic acid (Ni-NTA), cobalt nitrilotriacetic acid (Co-NTA), a HaloTag® Ligand (e.g. from Promega), a SnapTag® Ligand (e.g. from NEB), a SpyTag or a Spy-Catcher or any other natural or synthetic chemical probe that can be used to selectively bind a specific analyte with or without a specific chemical or genetic tag such as a HisTag, a HaloTag®, a SnapTag®, SpyCatcher or SpyTag. The spacer (420) may have a fixed or a variable length and/or chemical composition. Having spacers (420) with different lengths and/or chemical composition within one EM grid (100) can affect the random angular distribution of the analyte (500) and promote different orientations for different analyte molecules (500). In turn, this can facilitate the acquisition of images of the analyte (500) in different orientations.

The non-random pattern may be a regular pattern, but this is not strictly required. Nevertheless, the non-random pattern is a predictable pattern, in the sense that, after an initial alignment, the locations of the linkers (400) (and therefore the analyte molecules 500) can be predicted relatively accurately (i.e. within the margins of experimental error). The desired spacing between adjacent linkers (400) typically depends on the analyte of interest (500; e.g. on its size or volume). Preferably, the spacing may be at least 2.5 times the radius of the analyte. For example, for an analyte with a maximum radius of 5 nm, a spacing of 12.5 nm could be used.

Example 1b

We now refer to FIG. 3, showing an EM grid (100) as described in Example 1a, but wherein different areas/zones (e.g. corresponding to different holes 211 in the mesh 210) on a single EM grid (100) are outfitted with different affinity groups; this different functionalization is indicated by numbers 1 through 4. In this way, the EM grid (100) allows to immobilize different types of analytes or to screen the different types of affinity groups for their binding with a single analyte.

Moreover, such a pattern of different functionalizations need not be limited to the microscale, but could also be realized on the nanoscale by attaching—in a controlled manner—linkers with different affinity groups in a local pattern.

Example 2: Fabrication of an EM Grid with a Functionalized Graphene Layer

In order to achieve a template of linkers with sub-100 nm periodicity on the surface of single-layer graphene (SLG), a combination of e-beam lithography (EBL) and covalent chemical functionalization could be used.

Example 2a: Patterning Graphene Using E-Beam Lithography

A thin positive e-beam photoresist is first spin-coated on SLG grown on Cu by chemical vapour deposition (CVD), whereby the preferred grain size of the 2D carbon crystal is larger than 100-200 μm.

The e-beam photoresist is then irradiated using a e-beam SEM lithography system, to define irradiated spots having a diameter down to 10 nm (or even smaller) in a non-random pattern (e.g. a regular pattern). The EBL system used can in principle allow an arbitrary pitch for the irradiated spots could in principle have an arbitrary pitch. Nevertheless, the pitch should be large enough to avoid overlap and/or interaction between adjacent immobilized analytes (e.g. large proteins), but small enough to allow a large number of analytes to be imaged in a single step. A pitch of 100 nm or lower could, for example, be used.

Next, the photoresist is developed to create openings corresponding to the irradiated spots, thereby exposing the graphene layer in a non-random pattern.

Alternatively, instead of writing the pattern directly on the substrate, a nanostamp can be fabricated (e.g. with e-beam lithography) with which a corresponding pattern can be produced (e.g. in a polymer mask) through nanoimprinting (see e.g. CHOU, Stephen Y., et al. Sub-10 nm imprint lithography and applications. *Journal of Vacuum Science & Technology B: Microelectronics and Nanometer Structures Processing, Measurement, and Phenomena*, 1997, 15.6: 2897-2904.). Here, a resist (e.g. a polymer) can be deposited on the Cu side of the SLG substrate. The nanostamp is then used to pattern the resist and a curing step is performed. Afterwards, the Cu is etched through the patterned resist to create openings corresponding to the nanostamp, thereby exposing the graphene layer in a non-random pattern.

The patterned SLG (P-SLG) with exposed graphene spots is subsequently covalently functionalised (see Example 2b) to achieve an attachment of 0 or 1 linker molecules in each spot. The other parts of the graphene layer are still covered by the photoresist and hence shielded from functionalisation.

The photoresist is then removed to fully expose the graphene layer having attached thereon linkers in discrete positions in a non-random pattern.

Target analytes (e.g. in the form of a solution thereof) can then be applied to the graphene surface to bind the analyte selectively at the linker, e.g. achieving an immobilization of 0 or 1 analyte at each spot (i.e. each linker position). A non-random pattern of analytes on a support film is thereby achieved.

Example 2b: Functionalization of SLG using Diazonium Chemistry or Chemical Oxidation Functionalization of SLG using diazonium chemistry is carried out using a two-step method. In the first step, diazonium chemistry is employed for attaching functional groups (e.g. linker precursors) to pristine graphene. In the second step, additional moieties are added to the attached functional groups (see Example 2c), so as to form the actual linkers.

We now refer to FIG. 4. Reduction of diazonium reagents in the vicinity of a graphene surface produces an aryl radical which attaches itself to the surface via a C—C bond to form a linker precursor (401). The reduction can be achieved either using electrochemical activation or via chemical activation. The chemistry is in general robust and reproducible and has been shown to allow controlled functionalization of graphene as well as graphite. The attachment of carboxyphenyl groups to SLG (300) is for example explored, as it facilitates the attachment of further groups for forming linkers (400) with affinity groups (410). Raman spectroscopy and scanning tunnelling microscopy (STM) can be employed for evaluating the efficiency of functionalization. For the functionalization of SLG for EM grids (100), two approaches can for instance be used.

Alternatively, the functionalization can be based on chemical oxidation as opposed to diazonium chemistry. Here, SLG on a Cu substrate is functionalized using a chemical oxidation process, e.g. based on a modified version of Hummer's method (see e.g. LIU, Nan, et al. Bioactive functionalized monolayer graphene for high-resolution cryo-electron microscopy. *Journal of the American Chemical Society*, 2019, 141.9: 4016-4025.), whereby $KMnO_4$ is used to create reactive carboxyl groups. This is schematically depicted in FIG. 6.

The degree of functionalization of SLG (300) on EM grids (100) obtained using the different approaches can be compared using Raman spectroscopy.

Example 2c: Attachment of Bio-Specific Linkers to Functionalized Graphene

We now refer to FIG. 5 and FIG. 6. After initial carboxyphenyl or carboxy functionalization (cf. Example 2b), the next step is to extend the linker precursors (401) to form therefrom linkers (400) with more specific affinity groups (410). A number of different affinity groups (410), such as Ni/Co-NTA, or a HaloLigand, are therefore attached to the carboxyphenyl groups (401) or carboxy groups already grafted to the SLG (300). In the case of carboxyphenyl functionalization, the coupling can be achieved using N,N'-dicyclohexylcarbodiimide (DCC), which allows amide formation under relatively mild conditions. In the case of carboxy functionalization, reaction with reactive amine groups can be achieved using 1-ethyl-3-(3-dimethylaminopropyl)carbodiimide (EDC) and N-hydroxysulfosuccinimide (sulfo-NHS) as intermediate step. A library of EM grids with a support film (300) functionalized (Ni/Co-NTA, HaloLigand, etc.; or combinations thereof) in a non-random pattern can thereby be built. These EM grids (100) with patterned linkers (400) consisting of spacers (420) and affinity groups (410) are then available for affinity-based binding and immobilization of different analytes.

Example 2d: Validation of the Graphene Affinity Grids by Fluorescence and Electron Microscopy The fabricated EM grids can be validated using fluorescence and electron microscopy. A plasma cleaning and glow-discharge protocol are therefore established, focusing especially on preventing a-specific binding of contaminants to the affinity groups on the support film. The presence and spread of the linkers on EM grid can be validated with fluorescent microscopy using as analyte His-tag fluorescent proteins (e.g. enhanced green fluorescent protein, eGFP, or the red fluorescent protein mCherry) and/or in-house developed fluorescently labelled single domain antibodies targeting the HaloTag. Positive results are validated further to verify the angular distribution of the protein particles, this is done using cryo-electron microscopy and 2D classifications of the individual particle projections. Instead of immobilizing proteins (weak phase objects), functionalized gold particles can alternatively be immobilized and used as a validation tool.

Example 2e: Illustration of EM Grid Fabrication

Figure 7:
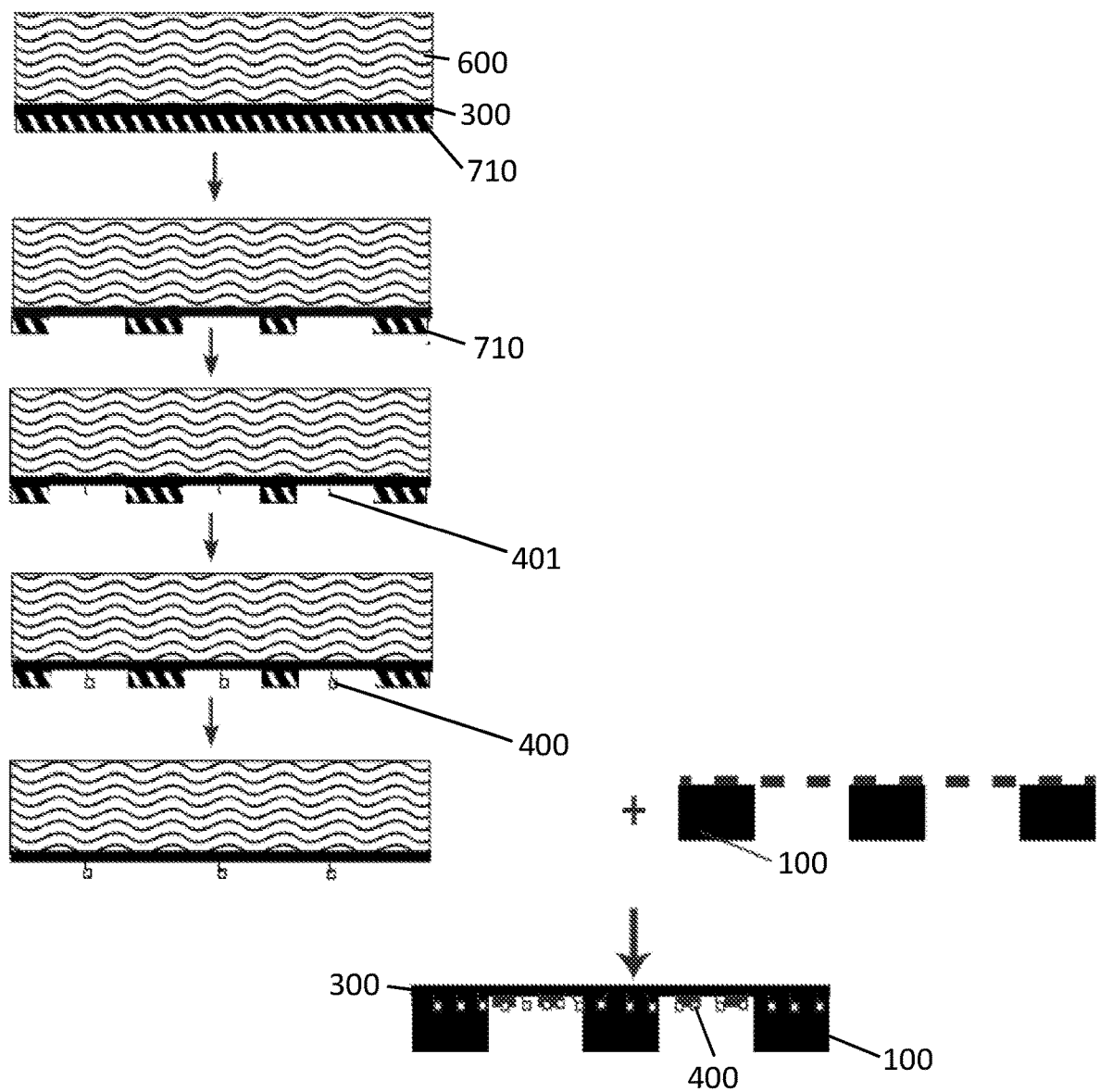
FIG. 7, FIG. 8 and FIG. 9 schematically depict further strategies for providing a functionalized support film on a perforated substrate, in accordance with an exemplary embodiment of the present invention.
Figure 8:
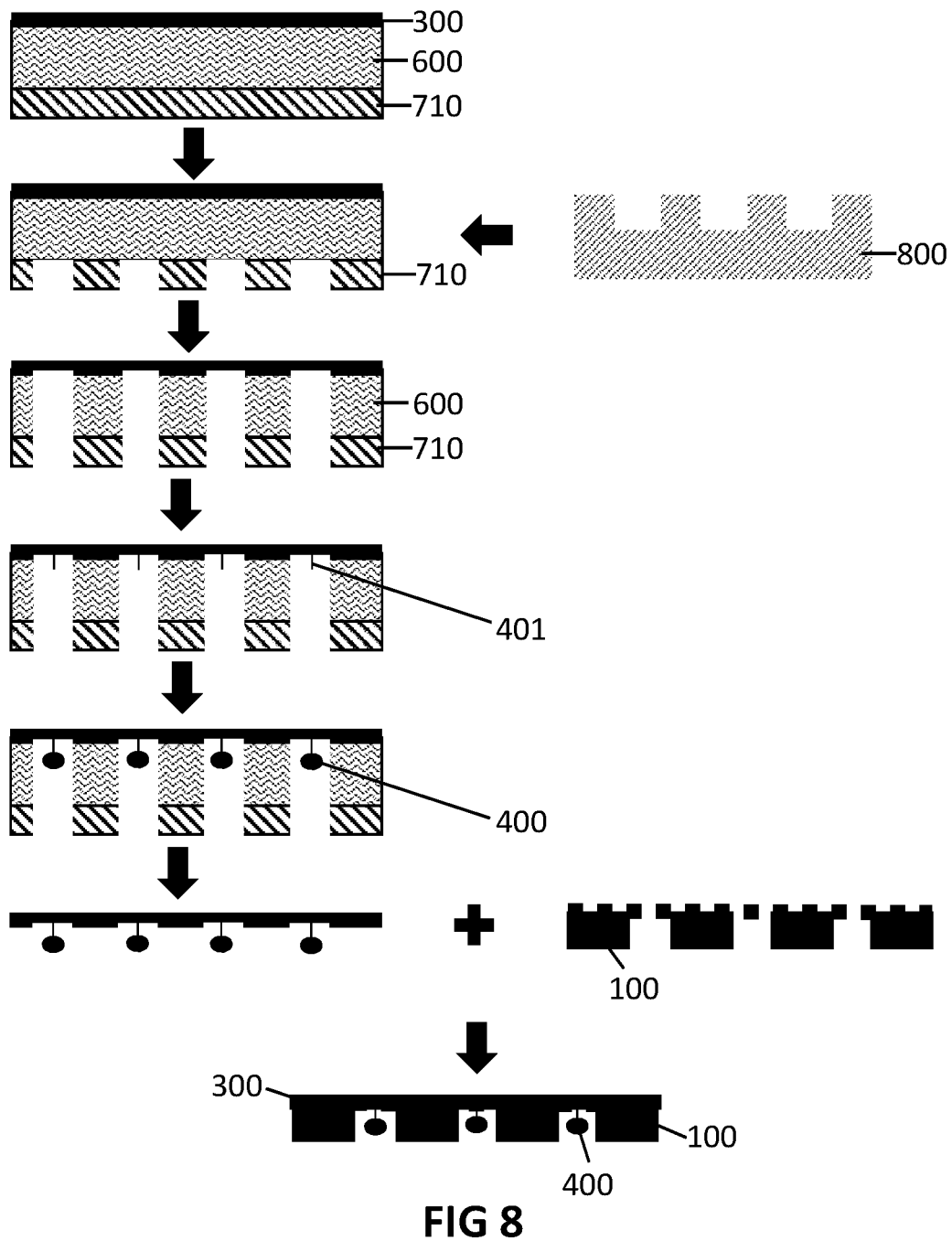

Two illustrative approaches to EM grid fabrication are depicted in FIG. 7 and FIG. 8, respectively. In both, functionalization of SLG (300) on solid substrates (600) is performed, followed by transfer of the SLG (300) to an EM grid (100), such as a Quantifoil Au 300 1.2/1.3 non-copper grid.

To this end, CVD grown SLG (300) on Cu (600) is subjected to direct EBL (cf. FIG. 7) or nanostamp (800) (cf. FIG. 8) patterning as described in Example 2a.

The photoresist (710) (e.g. PMMA) and graphene, P-SLG (300), is then subjected to covalent functionalization prior to transferring it to the EM grid (100). The functionalization comprises two steps, whereby the first step involves electrochemical reduction of diazonium salts or chemical oxidation for covalent attachment of carboxyphenyl or carboxy units as linker precursors (401) to the SLG (300) (cf. Example 2c). This step can also be done before deposition of the photoresist (710). This initial step is followed by a subsequent chemical reaction that attaches the actual linkers with functional groups covalently to these precursors (cf. Example 2d).

After functionalization, the functionalized graphene (300) is transferred to the EM grid (100). This can be done using a polymer-based transfer or sandwich-based transfer. For the latter, individual discs are punched out of the SLG (300) on Cu (600) with a similar diameter as the EM grid (100), followed by removal of the PMMA layer. The transfer of patterned functionalized SLG (300) discs to the EM grid (100) can be done using a sandwich-based procedure similar to the one described by Passmore and Russo (PASSMORE, Lori A.; RUSSO, Christopher J. Specimen preparation for high-resolution cryo-EM. In: *Methods in enzymology. Academic Press,* 2016. p. 51-86.), whereby both the SLG (300) disc and the EM grid are placed between two glass slides. The copper substrate (600) is removed—before or after transfer—using an etchant solution, leaving the gold grid (e.g. Quantifoil Au 300 1.2/1.3) unaffected.

Alternatively, the transfer can be done using a polymer-based wet or dry transfer, for example as described by Suk et al. (SUK, Ji Won, et al. Transfer of CVD-grown monolayer graphene onto arbitrary substrates. *ACS nano,* 2011, 5.9: 6916-6924.). In our experience, polymer-based graphene transfer methods can allow for a higher-throughput transfer procedure—with good quality graphene—but do typically benefit from an optimized protocol for polymer dissolving (e.g. based on organic solvents, such as hot aceton).

Figure 9:
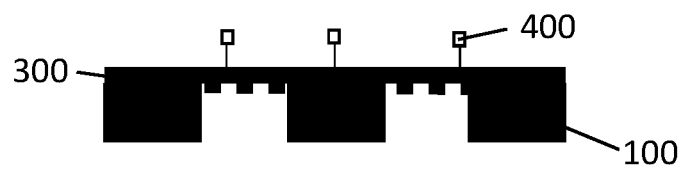

Note that although FIG. 7 and FIG. 8 both show the linkers (400) facing downwards, this orientation of the linkers (400) with regard to the EM grid (100) can be controlled through variations in the patterning procedure and/or the transfer procedure. In doing so, the linkers can for instance be oriented towards the EM grid (100) (as shown in FIG. 7 and FIG. 8) or upwards, away from the EM grid (100) (as shown in FIG. 9). For example, by applying the resist layer (710) directly on-top of the support film (300) in FIG. 8—rather than on the Cu layer (600)—, the linkers (400) can be applied on the opposite face of the support film (300) and the chemical groups can be oriented upwards after the transfer (e.g. polymer-based transfer). The orientation of the linkers and hence the position of the sample may typically have an influence on a subsequent vitrification procedure of the grid.

In a preferred embodiment, the patterning may be done using the nanostamp, linker precursors may be formed by chemical oxidation and transfer may be performed by a polymer-based method.

Example 3: Use of the EM Grid to Improve the Analyte Image Acquisition and/or Image Processing Since the linkers are attached in a predictable pattern, this non-random pattern can be input into a particle picking algorithm, e.g. during image acquisition and/or image processing. After overlaying and aligning the non-random pattern that is input with the corresponding pattern on the support film, the particle picking algorithm can then can use said pattern as a guide to locate the analyte molecules. The possibilities where analytes can be found on the EM grid are thereby reduced, from an essentially infinite number of random locations in a continuous spread over an imaged area, to a discrete number of predictable locations (corresponding to the non-random pattern). The particle picking algorithm can therefore be made to function much more quickly and accurately. Additionally, since contaminants typically show no particular affinity to the linkers, they remain spread out randomly over the EM grid and can therefore be more easily discerned (and filtered out) from the analyte.

Example 4: Example of Non-Random Pattern for Linkers on a Support Film

Figure 10:
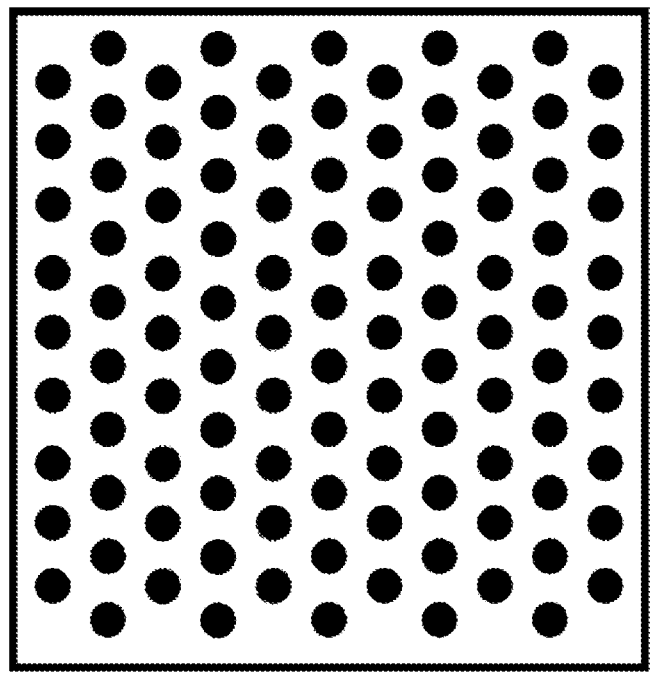
FIG. 10 and FIG. 11 give an example of non-random pattern for linkers on a support film.
Figure 11:
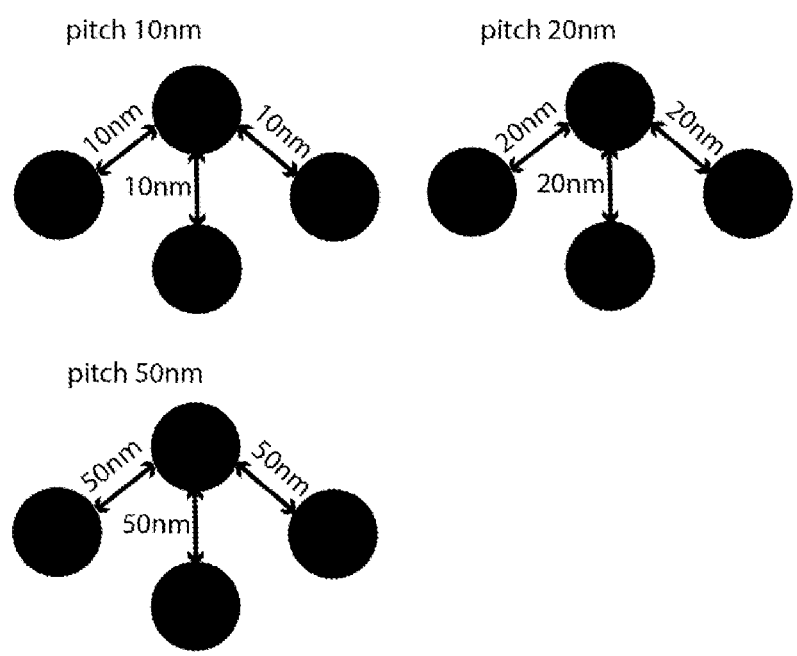

FIG. 10 shows a regular hexagonal non-random pattern. In this pattern, the points of attachments of the linkers within each row is offset with respect to the points of attachments within neighbouring rows, thereby forming diagonal lines of points of attachments. This offset is here equal to half the distance between two points of attachments. As depicted in FIG. 11, the pitch within a row is equal to the pitch within diagonal lines of points of attachment, thereby generating a hexagonal pattern.

It is to be understood that although preferred embodiments, specific constructions and configurations, as well as materials, have been discussed herein for devices according to the present invention, various changes or modifications in form and detail may be made without departing from the scope and technical teachings of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. An electron microscopy grid, comprising:
   (i) a perforated substrate,
   (ii) a support film on the perforated substrate, the support film having a thickness of 60 Å or less, and
   (iii) linkers attached on top of the support film in linker regions, the linkers comprising at least one affinity group for immobilizing an analyte;
   wherein the linker regions having the linkers form a non-random pattern on the support film, the linker regions having a width of 20 nm or less, and
   wherein the linkers comprise linkers of differing lengths and/or differing morphology, so as to promote different analyte orientations.

2. The electron microscopy grid according to claim 1, being a cryo-electron microscopy grid.

3. The electron microscopy grid according to claim 1, wherein the support film is an atomic monolayer or a molecular monolayer.

4. The electron microscopy grid according to claim 1, wherein the linkers comprise at least one first linker comprising a first affinity group and at least one second linker comprising a second affinity group, the second affinity group differing from the first affinity group.

5. The electron microscopy grid according to claim 1, wherein each of the linkers has a point of attachment to the support film and wherein the points of attachment form a regular pattern having a pitch of between 10 and 300 nm.

6. A method for processing an electron microscopy image of an electron microscopy grid according to claim 1, the electron microscopy grid comprising an analyte immobilized at predetermined positions thereof according to the non-random pattern, the method comprising the steps of:
   (a1) overlaying and aligning with the non-random pattern present in the image, a template non-random pattern of locations stored in a memory and corresponding to the non-random pattern present in the image,
   (a2) selecting image regions from the electron microscopy image, each selected image region comprising a single location of the template non-random pattern, and
   (b) processing the selected image regions to extract structural information of the analytes.

7. A method for acquiring and processing electron microscopy images of an electron microscopy grid as defined in claim 1, the electron microscopy grid comprising an analyte immobilized at predetermined positions thereof according to the non-random pattern, the method comprising the steps of:
   (a1) overlaying and aligning with the non-random pattern present in the electron microscopy grid, a template non-random pattern of locations stored in a memory and corresponding to the non-random pattern present in the grid,
   (a2) selecting grid regions from the electron microscopy grid, each selected grid region comprising a single location of the template non-random pattern,
   (b) acquiring images for each selected grid region,
   (c) processing the acquired images to extract structural information of the analytes.

8. A system adapted to carry out the method of claim 6.

9. A system adapted to carry out the method of claim 7.

10. A computer program comprising instructions which, when the program is executed by a computer, cause the computer to carry out the method of claim 6.

11. A computer program comprising instructions which, when the program is executed by a computer, cause the computer to carry out the method of claim 7.

12. A non-transitory computer-readable medium comprising instructions which, when executed by a computer, cause the computer to carry out the method of claim 6.

13. A non-transitory computer-readable medium comprising instructions which, when executed by a computer, cause the computer to carry out the method of claim 7.

14. A method for forming an electron microscopy grid comprising a perforated substrate having a support film thereon, comprising:
   (a) attaching linkers in a non-random pattern on top of a support film, the linkers comprising at least one affinity group for immobilizing an analyte and comprising linkers of differing lengths and/or different morphology, so as to promote different analyte orientations, the support film having a thickness of 60 Å or less;
   wherein either
   the support film is on the perforated substrate, or
   the method further comprises a step b, performed after step a, of:
   (b) providing the support film on the perforated substrate;
   wherein step (a) of attaching linkers on top of the support film comprises:
   (a1) providing a patterned mask on top of the support film, the patterned mask having openings therein forming a non-random pattern, the openings exposing the support film and having a width of 20 nm or less;
   (a2) attaching in the openings the linkers or precursors thereof to the exposed support film;
   (a3) removing the patterned mask; and
   (a4) if precursors are attached in step a2, transforming the precursors into the linkers, wherein step a4 is performed after step a2 and either before or after step a3.

15. The method according to claim 14, wherein the support film in step a is on an auxiliary substrate and wherein step b of providing the support film on the perforated substrate comprises transferring the support film from the auxiliary substrate to the perforated substrate.

16. A kit-of-parts for forming an electron microscopy grid, comprising:
   (i) a perforated substrate,
   (ii) a support film having a thickness of 60 Å or less, and having linkers attached to linker regions thereon in a non-random pattern, the linker regions having a width of 20 nm or less, the linkers comprising at least one affinity group for immobilizing an analyte and comprising linkers of differing lengths and/or differing morphology, so as to promote different analyte orientations.

* * * * *